United States Patent [19]
Masuda

[11] Patent Number: 5,995,118
[45] Date of Patent: Nov. 30, 1999

[54] DATA CODING SYSTEM AND DECODING CIRCUIT OF COMPRESSED CODE

[75] Inventor: Kazuya Masuda, Nara, Japan

[73] Assignee: Sharp Kabushiki Kasiha, Osaka, Japan

[21] Appl. No.: 08/652,812

[22] Filed: May 23, 1996

[30] Foreign Application Priority Data

May 31, 1995 [JP] Japan .................................. 7-134480

[51] Int. Cl.⁶ .................................................. H03M 7/40
[52] U.S. Cl. ......................................................... 345/467
[58] Field of Search ...................... 341/65; 345/467–472

[56] References Cited

U.S. PATENT DOCUMENTS

| | | | |
|---|---|---|---|
| 4,286,329 | 8/1981 | Goertzel et al. | 345/467 |
| 4,376,933 | 3/1983 | Saran et al. | |
| 4,568,983 | 2/1986 | Bobick | 358/261.1 |
| 4,646,617 | 7/1997 | Ohmoto et al. | 341/51 |
| 5,512,896 | 4/1996 | Read et al. | 341/65 |

FOREIGN PATENT DOCUMENTS

63-232626  9/1988  Japan .

OTHER PUBLICATIONS

Ong et al., Compression of Chinese Text Files Using a Multiple Four–Bit Coding Scheme, IEEE Singapore ICCS/ISITA '92, pp. 1062–1066, Nov. 1992.

Ong et al., An Efficient Data Compression Scheme Based on Semi–Adaptive Huffman Coding for Moderately Large Chinese Text Files, IEEE Singapore Intl Conf on Networks & Intl Conf on Information Engineering, pp. 332–336 Jul. 1995.

Ong et al., Compressing Chinese Text Files Using an Adaptive Huffman Coding Scheme and a Static Dictionary of Character Pairs, IEEE Singapore Intl Conf on Networks & Intl Conf on Information Engineering, Sep. 1993.

M. Nagao, "Data Compression of Chinese Character Patterns", Proceedings of the IEEE, vol. 68, No. 7, Jul. 1980, pp. 818–829, USA.

*Primary Examiner*—Anton Fetting
*Attorney, Agent, or Firm*—Dike, Bronstein, Roberts & Cushman, LLP; David G. Conlin; Lisa Swiszcz Hazzard

[57] ABSTRACT

A data coding system is arranged such that character font data is compressed in a unit of 4-bit in a form of a bit string with a compression width of 4-bit in the Huffman coding system. The data coding system employs a code structure in the Huffman coding system for respectively converting three bit strings selected in order from that of the highest appearance frequency in a unit of 4-bit in the character font data into the compressed codes expressed using not more than 3 bits. The described system permits a significantly improved compression rate of the character font data into respective compressed codes.

4 Claims, 4 Drawing Sheets

ROW SCAN
COMPRESSION 1  0011 ( 2 ) = 3 ( 10 )

2  1111 ( 2 ) = 15 ( 10 )

COLUMN SCAN
COMPRESSION 1  0000 ( 2 ) = 0 ( 10 )

2  0000 ( 2 ) = 0 ( 10 )

DATA CODING SYSTEM AND DECODING CIRCUIT OF COMPRESSED CODE

FIELD OF THE INVENTION

The present invention relates to a data coding system and a decoding circuit of compressed codes obtained by the data coding system to be adopted in an information processing apparatus for processing a digital signal, such as a printer, a word processor, a personal computer, etc.

BACKGROUND OF THE INVENTION

Conventionally, the Huffman coding system is known as a data coding system of a file composed of data such as character data, etc., to be adopted in an information processing apparatus for processing a digital signal, such as a personal computer, etc.

In the Huffman coding system, a compression table of a coding system in which compressed codes are given to character data from the shortest bit string to the longest bit string in order from the highest appearance frequency (probability) is adopted. Referring to the compression table, the character data in the file is converted into the compressed codes to form a compressed file. Then, the compressed codes of the compressed file are restored to the original character data referring to the compression table.

Specifically, in the Huffman coding system, by expressing each data such as characters, etc., in the file of the document, etc., in such a manner that the character data which appears frequently is expressed using compressed codes of, for example, four bits, and the character data which appears less frequently is expressed using compressed codes of, for example, around 10 bits, the size of the compressed file can be significantly reduced.

However, in the described Huffman coding system, as the compression table is fixed, in the case of compressing the data in the file, composed of character data including many special characters, the data compression efficiency greatly drops.

To eliminate the described problem, for example, Japanese Laid-Open Patent Application No. 232626/1988 (Tokukaisho 63-232626) discloses a hardware based data compression/restoring system wherein an adaptive coding system in which a compression table varies according to the appearance frequency of each character data is adopted in replacement of the conventional static Huffman coding system using the fixed compression table.

According to the described conventional Huffman coding system, as the compression is carried out based on a unit of 8 bits, which is advantageous in processing data in the microprocessor, in the case of converting a minimum unit of 8-bit into the compressed code, the compression table would contain 256 kinds of compressed codes.

As described, in the conventional coding system, in the case of compressing character font data by the described Huffman coding system, if the compression is performed in the unit of 8-bit, the kinds of the compressed codes would be expanded to 256 kinds. However, the described coding system has such a drawback that the appearance frequency of each code would be broadly distributed (scattered), thereby presenting the problem that there is a limit in improving an efficiency in compressing the character font data.

When the described coding system of Japanese Laid-Open Patent Application No. 232626/1988 (Tokukaisho 63-232626) is applied to the character font data, the compression rate can be improved only within the known range, and an optimization of the data compression cannot be attained, thereby presenting the problem that there is a limit in improving the compression rate of the character font data.

SUMMARY OF THE INVENTION

An object of the present invention is to provide a data coding system and a decoding circuit of compressed data which offer a significantly improved compression rate of the character font data to compressed codes as compared to the conventional coding system and the restoring circuit.

In order to fulfill at least the above-mentioned object, the data coding system for generating compressed codes by compressing character font data of digital data using the code structure in a Huffman coding system is arranged such that the character font data is compressed by sampling the character font data in a unit of a compression width of 4-bit.

According to the described coding system, by sampling the character font data by a unit of 4-bit, a variation in kinds of the compressed codes in the code structure can be reduced to 16 kinds, thereby achieving a narrow distribution of character font appearance frequency in a unit of 4-bit.

Moreover, as the described system deals with the character font data in a unit of 4-bit, multiples of such character font data include the character font data in a unit of 8-bit that is suited for processing the data in the information processing unit such as a microprocessor, etc. Therefore, the character font data in a unit of 4-bit can be converted into the character font data in a unit of 8-bit with ease.

Therefore, the described system permits a variation in kinds of the compressed code in the code structure to be reduced to 16 kinds by sampling the character font data in a unit of 4-bit, thereby achieving a narrow distribution of character font data appearance frequency in a unit of 4-bit. As a result, an improved efficiency in compressing data into compressed codes in the Huffman coding system can be achieved.

The data coding system of the present invention may be arranged such that the code structure in the Huffman coding system includes compressed codes indicative of three data selected in order from that of the highest appearance frequency, respectively composed of bit strings of not more than 3 bits, and a delimiter bit added at an end of each compressed code to add an identification function in the code structure.

According to the described coding system, as the delimiter bit which adds an identification function in the code structure is added at the end of each compressed code in the code structure, even when a bit string of each compressed code is inputted in a form of a fixed length, each compressed code of a variable length can be distinguishably recognized from the bit string of the fixed length by the delimiter bit, thereby permitting a restoration of the original character font data from the described compressed codes according to the code structure.

Namely, as the described coding system which adopts the code structure permits the original character font data to be restored from respective compressed codes on a hardware basis, a prompt restoration of compressed codes can be achieved by processing the data on the hardware basis.

Moreover, in the described coding system, setting the compression width in the character font data to 4-bit results in a significantly higher distribution of the appearance frequencies of the three data selected from that of the highest appearance frequency other data can achieve.

The described coding system includes compressed codes indicative of three data selected in order from that of the highest appearance frequency font data, composed of bit strings of not more than 3 bits in the code structure, thereby achieving the coding system which permits the three data selected from that of the highest appearance frequency to be compressed preponderantly. Therefore, the described coding system offers a still improved efficiency in compressing the data into respective compressed codes.

Such effect is more appreciated when dealing with a Chinese character generator as the character font data, and is even more appreciated when the Chinese character generator is of a high precision of not less than a matrix of 40-dot in length×40-dot in width.

A decoding circuit of compressed codes to be adopted in the data coding system of the present invention includes:

a bit decoder to which the compressed data are inputted bit by bit in serial, for setting a number of bits to be read in the compressed code by detecting a delimiter bit which separates one code from another in the compressed code;

an appearance frequency level decoder which respectively outputs restoration codes in 16 levels corresponding to the compressed codes based on the bit decoder; and conversion means which converts each restoration code to a reconstituted data of 4-bit based on a conversion table and outputs the reconstituted data.

According to the described arrangement, with respect to a delimiter bit which separates one code from another added at the end of each compressed code in the code structure, the bit decoder is added for detecting the delimiter corresponding to each restoration code from the compression code to enable the delimiter corresponding to the restoration code to be detected from the compression code.

According to the described arrangement, each restoration code of 16 levels can be outputted from the compressed code from the bit decoder and the appearance frequency level decoder, and the reconstituted data can be obtained based on the conversion table from each restoration code by the conversion means.

Therefore, the reconstituted data as the original character font data can be achieved on a hardware basis from the compressed codes, and the decoding can be performed at high speed.

The novel features which are considered as characteristic of the invention are set forth in particular in the appended claims. The improved treatment method, as well as the construction and mode of operation of the improved treatment apparatus, will, however, be best understood upon perusal of the following detailed description of certain specific embodiments when read in conjunction with the accompanying drawings.

BRIEF DESCRIPTION OF THE DRAWINGS

FIG. 1(a) and FIG. 1(b) are explanatory views of a data coding system of the present invention wherein a compression bit width of character font data is set to 4-bit, wherein:

FIG. 1(a) shows a bit string of the compression bit width in a row scanning direction in the character font data; and FIG. 1(b) shows a bit string of the compression bit width in a column scanning direction in the character font data.

DESCRIPTION OF THE EMBODIMENTS

First Embodiment

The following descriptions will discuss one embodiment of the present invention in reference to FIG. 1 through FIG. 4.

Figure 2:
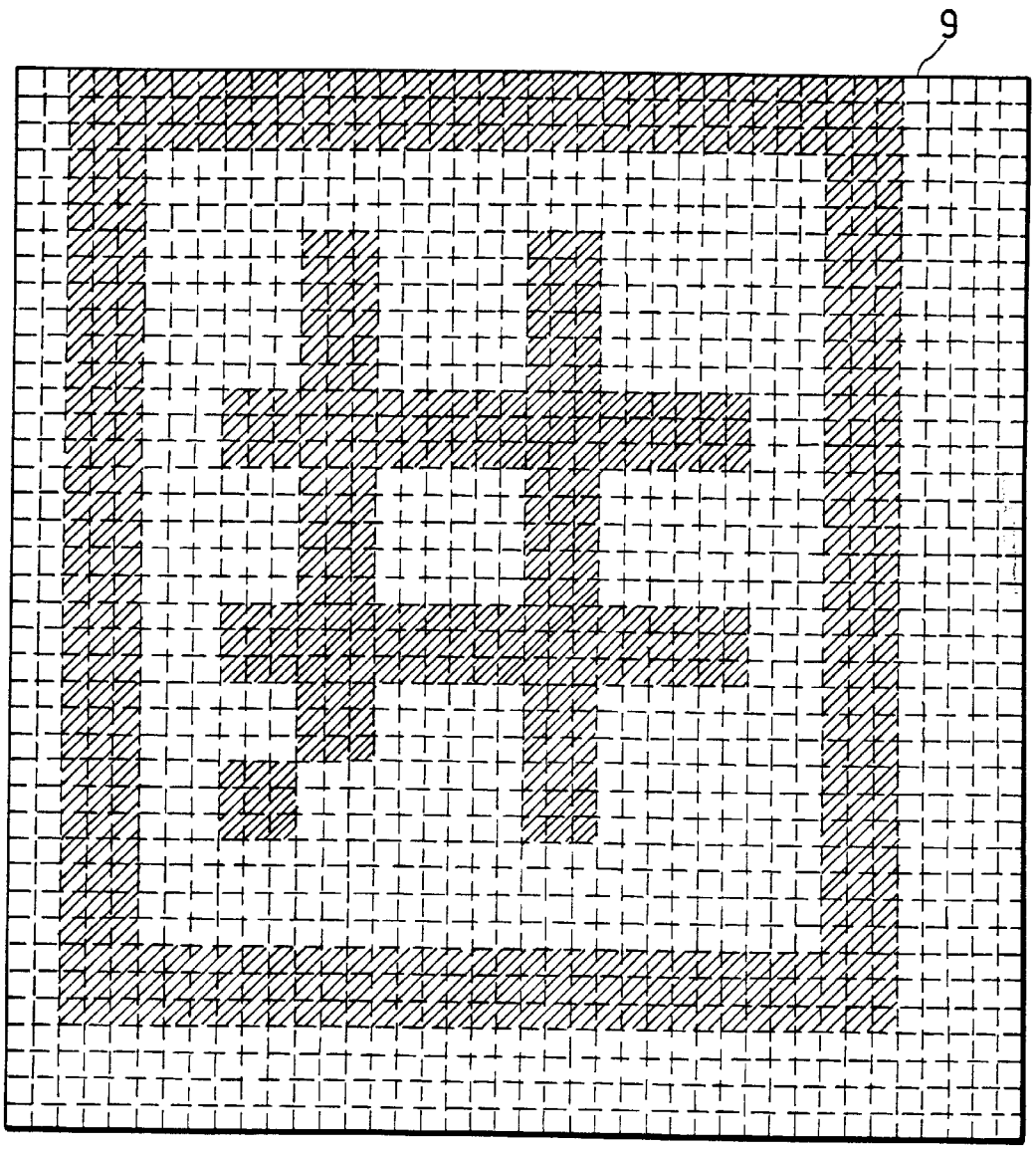
FIG. 2 is an explanatory view showing one example of the character font data.

In a data coding system of the present embodiment, a character font data 9 of a Chinese character generator of a matrix of 40-dot×40-dot shown in FIG. 2 is used for data to be compressed. The character font data 9 can express characters of various kinds by font data indicative of white or black in each square of a matrix of 40-dot×40-dot. In the present embodiment, the font data indicative of white is represented by "0", and the font data indicative of black is represented by "1".

Figure 1:
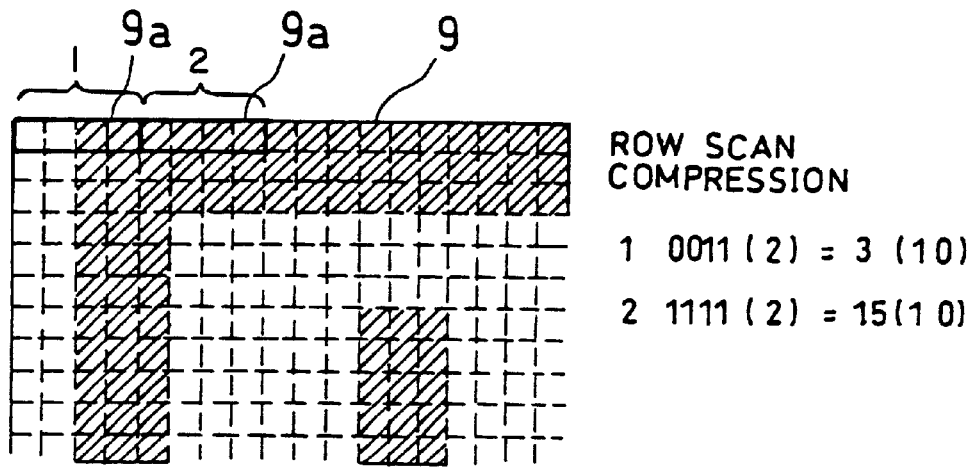
Figure 1:
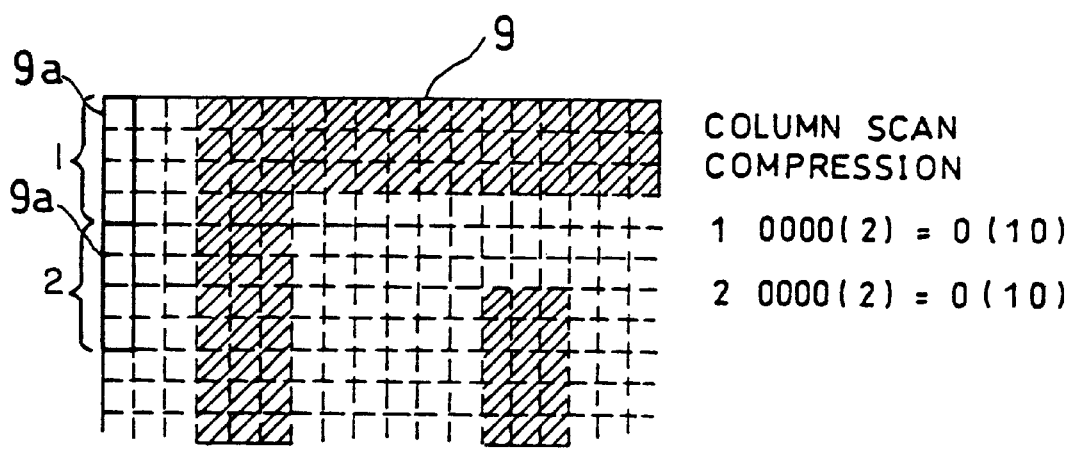

In the data coding system, the compression bit width for data compression in each font datum of the character font data 9 is selected to be 4-bit in a form of a bit string 9a in a unit of 4-bit as shown in FIG. 1.

Specifically, when compressing the character font data 9 by the row-scan/column-scan in the Chinese character generator, for example, in the row scan in the direction of row, as shown in FIG. 1(a), when the bit string 9a is "0011"(2) as indicated by ①, the compressed code is set to "3"(10). Here, (2) indicates the binary system, and (10) indicates the decimal system.

Specifically, for example, when the bit string 9a is "1111" (2) as shown indicated by ②, the compressed code is set to "15"(10). On the other hand, for example, in the column scan in the direction of column, when the bit string is "0000" (2) as shown by ① and ②, the compressed code is set to "0"(10) as shown in FIG. 1(b).

As described, by setting each bit string 9a to a width of 4-bit, there exist many bit strings 9a of the compressed code of "0"(10) corresponding to the code "0000"(2) indicative of a space portion. An appearance frequency distribution of each bit string 9a of FIG. 3 shows that it is preferably to perform data compression in a unit of a width of 4-bit.

As described, by setting the width of the bit string 9a to 4-bit for data compression, the variation in kinds of each bit string 9a of the character font data 9 to be compressed can be reduced to 16 kinds, and the narrower appearance frequency distribution of respective bit strings 9a can be obtained, thereby providing an optimal condition of respective bit strings 9a in a unit of 4-bit for high density data compression.

Figure 3:
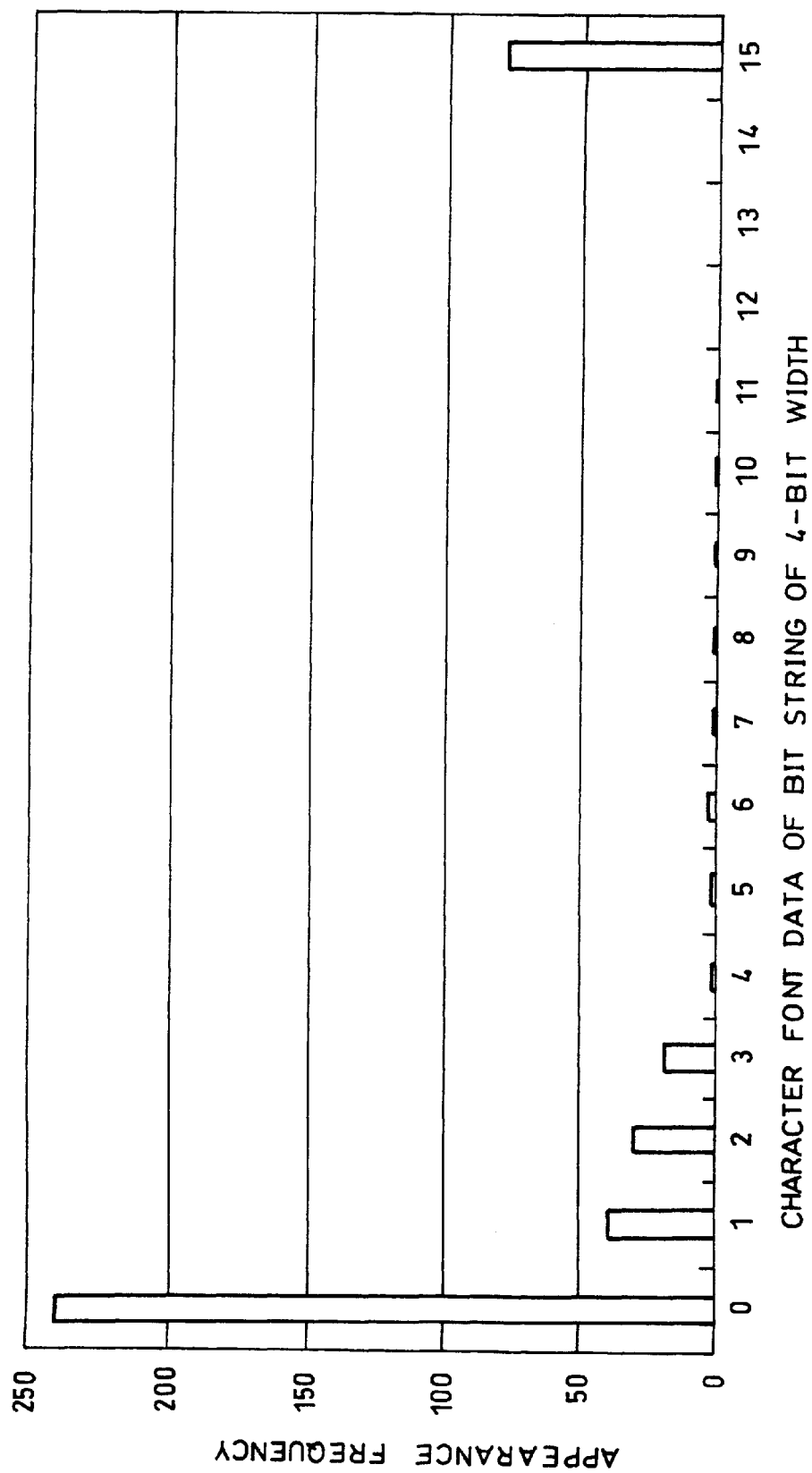
FIG. 3 is a graph showing an appearance frequency of each datum expressed in 16 levels with a compression bit width of 4-bit in the character font data.

Furthermore, by summarizing the appearance frequency distribution of respective bit strings 9a of the character font data 9, it can be seen that the appearance frequency distribution of the bit strings is centralized on the three codes of higher frequency among all the codes as is clear from FIG. 3.

The bit strings 9a of the three codes of higher frequency can be listed as follows from the highest appearance frequency: 0000(2), 1111(2), and 0001(2) which respectively correspond to the compressed codes of "0"(10), "15"(10), and "1"(10) and correspond to the bit strings of the compressed codes of "0"(2), and "110" (2).

According to the described data coding system, by adopting the code structure which permits the bit strings 9a on the described three codes to be preponderantly compressed, the compression rate of the character font data 9 can be significantly improved. Based on this assumption, the inventors of the present invention investigated on the code structure, and found that a code structure of a Huffman tree shown in the Table 1 is preferable.

TABLE 1

| ORDER OF APPEARANCE FREQUENCY | COMPRESSED CODE | NUMBER OF BITS |
|---|---|---|
| 1 | 0 | 1 |
| 2 | 100 | 3 |
| 3 | 110 | 3 |
| 4 | 1010 | 4 |
| 5 | 1110 | 4 |
| 6 | 10110 | 5 |
| 7 | 11110 | 5 |
| 8 | 101110 | 6 |
| 9 | 111110 | 6 |
| 10 | 1011110 | 7 |
| 11 | 1111110 | 7 |
| 12 | 10111110 | 8 |
| 13 | 11111110 | 8 |
| 14 | 101111110 | 9 |
| 15 | 111111110 | 9 |
| 16 | 1011111110 | 10 |

This data coding system is arranged such that the width is doubled from 4-bit to 8-bit to be 1-byte by setting the width to 4-bit which is suited for the microprocessor which performs the data coding in a unit of 8-bit.

According to the described method, by adding the code "0" at the end of a bit string of each compressed code of variable length in the code structure as a delimiter bit, the function of identifying one datum from another is added to the code structure by the delimiter. As a result, each compressed code to be inputted in serial can be recognized by the delimiter, thereby achieving a hardware structure which permits the decoding of the compressed codes to be accelerated with ease.

The decoding circuit adopted in the present embodiment for restoring the compressed codes in the data coding system will be explained in reference to FIG. 4.

Figure 4:
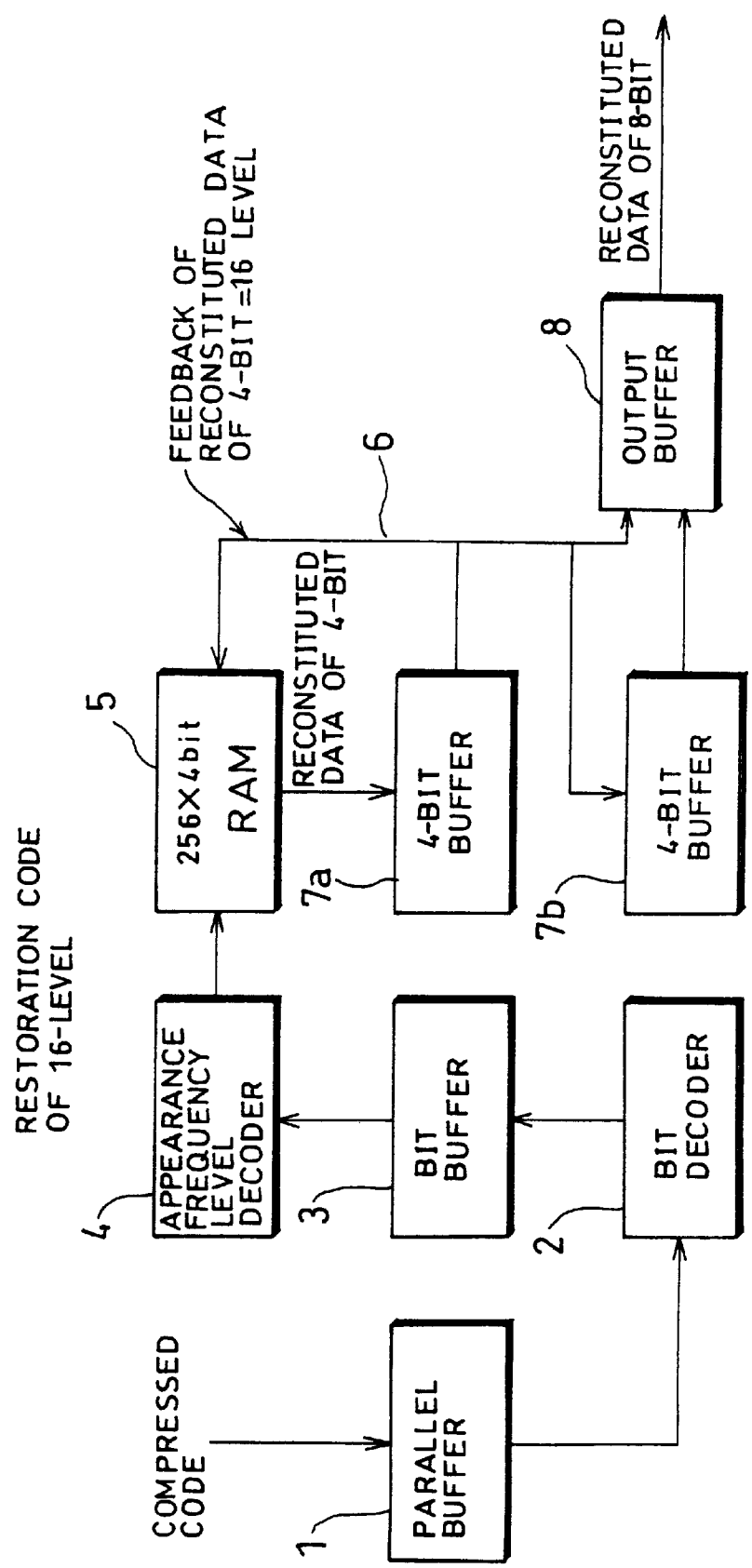
FIG. 4 is a block diagram of a decoding circuit of the present invention for restoring compressed codes.

In the decoding circuit, for example, to decode compressed codes obtained by compressing font data in the character font data 9 in Mincho typeface (Chinese character) as an example of a font type in the first standard/second standard of 48-dot×48-dot to the original character font data 9, as shown in FIG. 4, a parallel buffer 1 to which the compressed codes are inputted in serial, for storing the compressed codes, for example, in a unit of 4-bit is provided in parallel.

A bit decoder 2 to which serial bit strings of the compressed codes are inputted from the parallel buffer 1, for example, in a unit of 4-bit is provided. The bit decoder 2 detects the delimiter from each compressed code of a variable length in a form of the bit string to be inputted in serial to identify the bit width of each compressed code and further outputs the compressed code.

A bit buffer 3 to which a compressed code is inputted from the bit decoder 2 is provided so as to store respective compressed codes.

Further, an appearance frequency level decoder 4 to which compressed codes are inputted in serial from the bit buffer 3 is provided so as to convert respective compressed codes into corresponding restoration codes in 16 levels. The appearance frequency level decoder 4 stores therein a restoration table corresponding to the code structure of Table 1 for use in converting compressed codes into restoration codes.

A RAM (conversion means) 5 to which restoration codes are inputted from the appearance frequency level decoder 4 is provided for restoring respective restoration codes to reconstituted data based on the adaptive Huffman coding system.

Each restoration code is inputted to the RAM 5, and the RAM 5 restores the reconstituted data of 4-bit based on the conversion table for restoration corresponding to respective appearance frequencies in the character font data in a unit of a width of 4-bit shown in FIG. 3.

The RAM 5 can take the appearance frequency of the reconstituted data into consideration by feeding back the reconstituted data of 4-bit restored to one stage before at the RAM 5 through a feedback line 6 via a 4-bit buffer 7a (to be described later), thereby permitting the restoration of the compressed codes in the adaptive Huffman coding system. Here, an initialization value for restoration is set to a code "0000" beforehand.

As described, the reconstituted data of 4-bit that is restored by the adaptive Huffman coding system in the described manner is outputted from the RAM 5. To restore the reconstituted data of 4-bit thus restored into the original character font data of a width of 8-bit by doubling the reconstituted data with a width of 4-bit, 4-bit buffers 7a and 7b are provided in such a manner that an output from the RAM 5 is inputted to the 4-bit buffer 7a, and an output from the 4-bit buffer 7a is inputted to the 4-bit buffer 7b.

An output buffer 8 to which respective outputs from the 4-bit buffers 7a and 7b are inputted in parallel is provided so as to output the reconstituted data of 8-bit obtained by doubling the reconstituted data of 4-bit. The output buffer 8 outputs the reconstituted data of 8-bit as the original character font data 9 to the signal processing means such as a microprocessor, etc.

As described, the system of the present embodiment is arranged such that the compression bit width of the character font data is set to 4-bit that is suited for processing the character font data 9 and also suited for processing the data by the microprocessor in the hardware, thereby achieving a significantly improved efficiency in compressing the data.

For example, in the case of processing the character font data 9 in Mincho typeface in the level 1/level 2 of 48-dot× 48-dot, the data compression rate from the character font data 9 to the compressed codes is 13/20 in the conventional system, while 4/10 in the system of the present embodiment which shows an improvement in data compression of 62.5 percent.

Further, in the system of the present embodiment, to identify each compressed code composed of a bit string in serial, a delimiter "0" is added at the end of each compressed code. When adopting such arrangement, a long time is required to identify each compressed code on the software basis; however, in the present embodiment, the process can be accelerated by arranging such that the decoding of the compressed code is carried out on the hardware basis.

In the arrangement of the present embodiment, by adding the delimiter to each compressed code in the code structure for data coding, the structure of the decoding circuit can be simplified, and a hardware based algorithm for use in decoding the compressed codes can be obtained at low cost.

In the described arrangement of the present embodiment, the decoding system, i.e., the conversion table which varies of the adaptive Huffman coding system is adopted; however, the present invention is not limited to such system. For example, the fixed type code structure such as a static Huffman coding system may be adopted for the code structure. In this case, the data can be reconstituted by restoring the restoration codes by the RAM 5 without taking the reconstituted data from the feedback line 6 in the above-mentioned arrangement into consideration.

The minimum storage capacity of the RAM 5 in the present embodiment is 16×16×4 bit in the adaptive Huffman coding, while 16×4 bit (or the same data) in the static Huffman coding system.

Without further analysis, the foregoing will so fully reveal the essence of the present invention that others can, by applying current knowledge, readily adapt it for various applications without omitting features that, from the standpoint of prior art, fairly constitute essential characteristics of the generic and specific aspects of the instant contribution to the art and, therefore, such adaptations should and are intended to be comprehended within the meaning and range of equivalence of the appended claims.

What is claimed is:

1. A data coding system for generating a compressed code by compressing character font data of digital data using a code structure in a Huffman coding system, wherein:

said character font data is a Chinese character indicated by light and shade of each point of a matrix of 8n-dot in length×8n-dot in width (where n is a positive integer); and the character font data is compressed by sampling the character font data in a unit of four linearly adjacent dots thereby to narrow the appearance frequency distribution of the possible sampled bit patterns with the output codes for the three most frequent patterns being bit strings of not more than three bits.

2. The data coding system as set forth in claim 1, wherein:

a delimiter bit is added at an end of each compressed code to add an identification function in the code structure.

3. A decoding circuit of compressed code in which each code represents four linearly adjacent dots of Chinese character font data with the codes for the three most frequent dot patterns being bit strings of not more than three bits, comprising:

a bit decoder to which the compressed code is inputted bit by bit in serial, for setting a number of bits to be read in the compressed code by detecting a delimiter bit which separates one code from another in the compressed code;

an appearance frequency level decoder which respectively outputs four bit restoration codes in 16 levels corresponding to the compressed codes based on said bit decoder; and conversion means which converts each restoration code to reconstituted dot pattern data of 4-bit based on a conversion table and outputs the reconstituted data, wherein said reconstituted data comprises character font data of a Chinese character indicated by light and shade of each point of a matrix of 8n-dot in length× 8n-dot in width (where n is a positive integer).

4. The decoding circuit of compressed code as set forth in claim 3, wherein:

the reconstituted data is indicated by light and shade of each point of a matrix of 48-dot in length×48-dot in width.

* * * * *